United States Patent
Roger et al.

(10) Patent No.: US 10,119,677 B2
(45) Date of Patent: Nov. 6, 2018

(54) LIGHTING DEVICE FOR A MOTOR VEHICLE, INCORPORATING MEANS FOR PROTECTION AGAINST ELECTROSTATIC DISCHARGES

(71) Applicant: VALEO VISION, Bobigny (FR)

(72) Inventors: Christophe Roger, Angers (FR); Jerome Jobard, Angers (FR); Pierre Placais, Angers (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/618,789

(22) Filed: Jun. 9, 2017

(65) Prior Publication Data

US 2017/0356619 A1    Dec. 14, 2017

(30) Foreign Application Priority Data

Jun. 9, 2016   (FR) ...................................... 16 55313

(51) Int. Cl.
| | |
|---|---|
| *H05K 9/00* | (2006.01) |
| *F21S 8/10* | (2006.01) |
| *F21S 45/10* | (2018.01) |
| *F21V 29/89* | (2015.01) |
| *B60Q 1/04* | (2006.01) |

(Continued)

(52) U.S. Cl.
CPC ................ *F21S 48/31* (2013.01); *B60Q 1/04* (2013.01); *B60Q 1/30* (2013.01); *F21S 41/19* (2018.01); *F21S 41/192* (2018.01); *F21S 41/285* (2018.01); *F21S 43/14* (2018.01); *F21S 43/19* (2018.01); *F21S 43/26* (2018.01); *F21S 45/10* (2018.01); *F21S 45/47* (2018.01);

*F21V 29/89* (2015.01); *H05K 1/0259* (2013.01); *H05K 9/0067* (2013.01)

(58) Field of Classification Search
CPC ... H05K 1/0259; H05K 9/0067; F21S 41/192; F21S 45/10; B60Q 1/30; B60Q 1/04
USPC ......................................................... 362/520
See application file for complete search history.

(56) References Cited

U.S. PATENT DOCUMENTS

2002/0151200 A1* 10/2002 Fauser ...................... H01T 4/08
439/181
2007/0274018 A1* 11/2007 Cruz .................... G01R 1/0433
361/220
(Continued)

FOREIGN PATENT DOCUMENTS

| DE | 20 2007 011 255 U1 | 11/2007 |
|---|---|---|
| DE | 10 2010 040 558 A1 | 3/2012 |

OTHER PUBLICATIONS

French Preliminary Search Report dated Aug. 31, 2016 in French Application 16 55313 filed on Jun. 9, 2016 (with English Translation of Categories of Cited Documents).

*Primary Examiner* — Christopher Raabe
(74) *Attorney, Agent, or Firm* — Oblon, McClelland, Maier & Neustadt, L.L.P.

(57) ABSTRACT

The invention proposes a lighting device for a motor vehicle. Such a device includes one or more electronic circuits incorporating electronic components sensitive to an electrostatic discharge. Thanks to the features of the invention, the components are protected by encouraging the controlled flow to ground of any electrostatic discharges. All portions of one or more electronic circuits can therefore be protected by preventing random electrostatic discharges liable to destroy or to degrade sensitive electronic components.

20 Claims, 1 Drawing Sheet

(51) Int. Cl.
*B60Q 1/30* (2006.01)
*H05K 1/02* (2006.01)
*F21S 41/19* (2018.01)
*F21S 41/20* (2018.01)
*F21S 43/19* (2018.01)
*F21S 43/14* (2018.01)
*F21S 43/20* (2018.01)
*F21S 45/47* (2018.01)

(56) References Cited

U.S. PATENT DOCUMENTS

2010/0202151 A1   8/2010  Kaak et al.
2013/0223024 A1   8/2013  Huebl et al.
2015/0224915 A1*  8/2015  Sazuka .................. F21S 45/43
                                                    362/516
2016/0238212 A1*  8/2016  Roger .................... F21S 48/31

\* cited by examiner

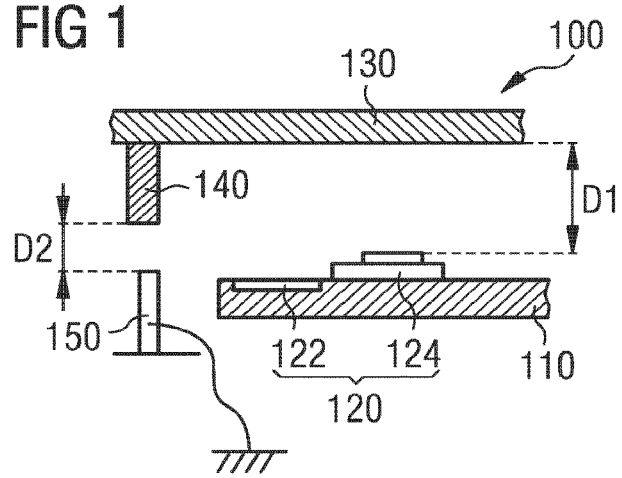
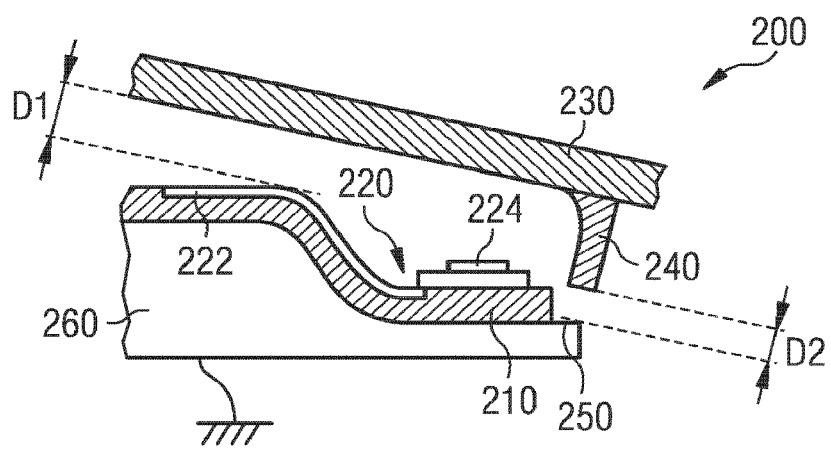
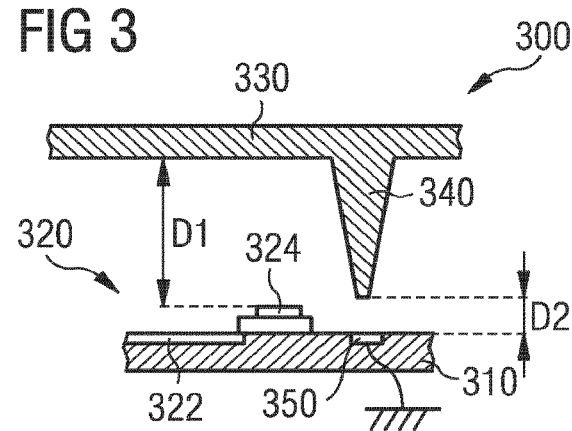

LIGHTING DEVICE FOR A MOTOR VEHICLE, INCORPORATING MEANS FOR PROTECTION AGAINST ELECTROSTATIC DISCHARGES

The invention relates to the field of lighting devices for a motor vehicle. The invention concerns in particular such devices using electronic components sensitive to electrostatic discharges, such as light-emitting diodes, for example.

In the field of lighting devices for motor vehicles, the use of light sources such as light-emitting diodes (LED), organic light-emitting diodes (OLED) or laser diodes is increasingly specified. The placement of these lighting means along precise contours in actual fact makes it possible to create interesting and individual optical signatures. However, these are sensitive electronic components, notably sensitive to electrostatic discharges. During the service life of a motor vehicle, such components may be exposed to electrostatic discharges inside the headlight of which they form part. For example, because of friction of the external air on the outer lenses of a headlight, portions of the latter may come to carry static charges. If the light sources are subjected to discharges coming from these portions, there is a high risk of premature deterioration or even premature destruction of the electronic components.

In order to protect light sources, it is known to provide protection electronic circuits in the lighting device. For example, an electrical capacitor may be connected in parallel with an LED, the capacitor being able to absorb any surge. However, the cost of such a solution increases in proportion to the number of LEDs used. Moreover, such protection circuits occupy a large portion of the respective printed circuit boards, and the amount of room inside the device is limited.

The patent document US 2002/0151200 A1 describes a circuit element for protecting an electronic device from surges that occur within the electronic circuit including a sensitive component. Such a system can be useful only if the surge can occur only at a predefined location of the circuit to be protected. Means adapted to redirect the surge to ground on the upstream side of the sensitive component may then be incorporated in the circuit to the protected. Such a solution is not applicable to cases as described, however, in which an electrostatic discharge may occur at random to an electronic circuit including one or more sensitive components. As the discharge can occur in different portions of the circuit to be protected, this known solution is not able to solve the problem described.

An objective of the invention is to alleviate at least one of the problems raised by the prior art. To be more precise, an objective of the invention is to propose a lighting device incorporating protection of electronic components sensitive to an electrostatic discharge.

The invention consists in a lighting device for a motor vehicle. The device includes a substrate on which is arranged at least one element of an electronic circuit. The electronic circuit includes at least one electronic component sensitive to an electrostatic discharge. The device also includes a structure that is distinct from the substrate and liable to carry electrical charges. The shortest distance between the structure and each of the elements of the circuit is equal to D1. The device furthermore comprises an electrically conductive means connected electrically to ground, that is to say to the zero reference potential. The device is noteworthy in that it comprises at least one protective element protecting against electrostatic discharges which is disposed on said structure and linked electrically to the latter, the smallest distance between the protective element and the electrically conductive means, D2, being less than D1.

Preferably, the protective element can be arranged so that the distance between the protective element and the sensitive electronic component is greater than the distance between the protective element and the electrically conductive element connected to ground, so that there is no flow of charge from the protective element to the component to be protected.

Preferably, the protective element is situated on a surface of said structure, said structure being oriented towards said substrate.

The distance D2 may preferably be strictly less than 10 mm, whereas the distance D1 may be strictly greater than 10 mm.

Preferably, the distance D2 is non-zero and there is no physical contact between the protective element and the electrically conductive means connected to ground.

The elements of the electronic circuit may preferably include electrically conductive tracks and electronic components connected to the tracks.

The protective element may preferably be a plastic material element, at least one portion of its surface being coated with an electrically conductive layer. This may be a layer of copper, aluminum or a metal alloy including an electrically conductive metal, for example.

The protective element may preferably have a base and extend from this base situated at the level of said structure, tapering so as to form a tip directed towards said electrically conductive means connected to ground.

The electrically conductive means may preferably comprise a zone of the substrate.

Preferably, the device can comprise a distinct metallic portion separate from the substrate, for example a heat dissipation means such as a radiator, of which said electrically conductive means forms part.

The electrically conductive means can be a zone of the surface of the substrate or of said metallic portion.

The protective element may preferably comprise an electrically conductive metallic material.

Preferably, the protective element may be integral with said structure. The protective element may preferentially be produced by deformation, in particular local, of the structure, for example at a location situated square with the electrically conductive means connected to ground.

The protective element may preferably be a portion which is fastened to said structure. The portion may preferably be fixed to the structure by screwing or by gluing.

The protective element may preferably be produced or fixed on a zone devoid of optical and/or esthetic role of said structure.

The substrate may preferably be the substrate of a printed circuit board (PCB). The substrate may preferably be plane.

Alternatively, the substrate may be the substrate of an interconnection device (MID) having a complex geometry. The substrate of the interconnection device may be molded or machined.

The electronic component may preferably be a light-emitting diode (LED), a laser diode or an organic light-emitting diode (OLED). The electronic circuit may preferably include a plurality of LEDs, OLEDs or laser diodes sensitive to electrostatic discharges.

The electrical circuit may include a group including a plurality of electronic components sensitive to electrostatic discharges, the electronic components of this group being interconnected. In this case, the device may include a protective element associated with this group and that is adapted to protect all the electronic components of this group on its own.

The electrical circuit may preferably include a plurality of groups each including a plurality of electronic components sensitive to electrostatic discharges, the electronic components of each group being interconnected. In this case, the device may include a plurality of protective elements, each protective element being associated on a one-to-one basis with one of the groups and being adapted to protect all the electronic components of that group on its own.

The structure liable to carry electrical charges may preferably be an element of the outer lens of the lighting device. It may in particular be a metalized plastic portion liable to carry electrical charges. The portion may preferably be aluminized.

The device may preferably be a head light or a rear light of a motor vehicle.

Compared to known solutions, the "lightning arrestor" effect produced by the features of the present invention makes it possible to reduce the manufacturing costs of a lighting device for a motor vehicle whilst providing long-lasting protection of the electronic components sensitive to electrostatic discharges. The measures in accordance with the invention define a low-impedance path between the structure liable to be charged, by way of the protective element connected thereto, and a zone electrically connected to ground, thereby encouraging the creation of discharge paths between the protective element on the one hand and the zone connected to ground on the other hand. In actual fact, as the distance D2 defined in accordance with the invention is less than the distance D1, the device encourages an electrostatic discharge between the protective element electrically connected to the structure liable to carry electrical charges, and the zone connected to ground, relative to the elements of the electronic circuit. The longevity of the electronic components and of the device are therefore increased and at the same time the complexity of the electronic circuits involved is reduced compared to known solutions. In actual fact, by applying the proposed invention, it is possible to dispense with dedicated protection circuits involving a capacitor for each of the light sources of such a device. This is of particular interest when a large number of such light sources, for example LEDs, is used in a lighting device in order to obtain a particular optical signature. One or more protection elements, easy to produce, and positioned in accordance with the features of the invention are capable of protecting a plurality of such light sources against random electrostatic discharges stemming for example from charges accumulated on a face of an outer lens of the device.

Other features and advantages of the present invention will be better understood with the aid of the description of an example and the drawings, in which:

FIG. 1 shows diagrammatically a lateral section of a preferred embodiment of the device in accordance with the invention;

FIG. 2 shows diagrammatically a lateral section of a preferred embodiment of the device in accordance with the invention;

FIG. 3 shows diagrammatically a lateral section of a preferred embodiment of the device in accordance with the invention.

In the following description, similar reference numbers will be used to describe similar concepts across different embodiments of the invention. Thus, the numbers 100, 200, 300 denote a device in accordance with the invention in three different embodiments.

Unless specifically indicated otherwise, the technical features described in detail for a given embodiment may be combined with the technical features described in the context of other embodiments described by way of nonlimiting example.

In the following description, components necessary for a lighting device for a motor vehicle to operate, but which have no direct impact on the present invention, will not be described explicitly, in order to preserve the clarity of the disclosure of the invention. In known manner, the light sources of a lighting device for a motor vehicle are supplied with power by a current source internal to the vehicle, such as the battery of the vehicle, and via a power supply control device generally including at least one converter. Suitable converters are known in themselves in the art and are able to convert an input direct current voltage into a different output direct current voltage suitable for the supply of power of the light source or sources of the device. A lighting device may also include in known manner optical means intended to guide the light rays emitted by the light source of sources of the device. These may be optical lenses and/or wave-guides, for example. A device in accordance with the invention may further provide one or more lighting functions of the motor vehicle in which it is installed. These may be, by way of nonlimiting example, daytime running lamp, high-beam or turn indicator functions.

FIG. 1 shows a diagrammatic illustration of the elements of a device 100 in accordance with a preferred embodiment of the invention. The device includes a substrate 110 that supports an electronic circuit 120. It may for example be a generally plane printed circuit board (PCB) or other substrates known in themselves in the art. The electronic circuit 120 includes conductive tracks 122 and components 124 connected by the conductive track. By way of nonlimiting example, a light-emitting diode (LED) 124 is shown. Although the substrate shown supports only one circuit, it may generally include a plurality of separate circuits providing different functions. The formation of conductive tracks on a substrate and the fixing of the components to the substrate are known in themselves in the art and will not be described in detail in the context of the present invention.

The device also includes a structure 130 that is liable to carry, at least temporarily, electrical charges. It is for example an element of the outer lens of the lighting device, which may become electrically charged when the vehicle is driven because of friction with the external air. It may also be an embellishment of the device. In the FIG. 1 illustration, the structure 130 is shown as being plane. The structure may nevertheless have different and more complex geometries. For example, the structure may have a geometry that is curved in at least one direction. The shortest distance between the substrate that supports the circuit 120 and the structure is indicated by the measurement D1. The distance in question is considered between all the points of the surface of the structure and all the points of the circuit to be protected.

In order to prevent a charge present on the structure 130 being discharged to one of the elements 122, 124 of the electronic circuit 120, which would cause damage to the components 124, a protective element or protection element 140 and an electrically conductive means 150 are provided. The protection element 140 has the single function of protecting the electronic circuit 120 against electrostatic discharges.

The protective element 140 may be integral with the structure 130 which is preferably made of plastic and of which at least the surface directed towards the substrate 110 is aluminized or metalized. The protective element 140 may in particular be the result of a local deformation of the structure 130. The protective element is disposed so as not to impair optical or esthetic functions of the structure 130. In the case illustrated, it is a separate portion linked in an electrically conducting manner to the structure 130, in such a way that static electrical charges accumulated on the structure 130 can migrate towards the protective element 140. Fixing is carried out by gluing, by screwing or by other suitable means.

The protective element extends from the surface of the structure 130 which is directed towards the substrate 110 towards an electrically conductive element 150, which is connected to ground. The disposition of the protective element 140 and of this element 150 connected to ground is such that the distance D2 which separates them is non-zero and strictly less than the distance D1. For example, the distance D2 is strictly less than 10 mm whereas the distance D1 is strictly greater than 10 mm.

These dimensions are obviously not limiting on the features of the invention. An electrical charge on the structure 130 seeks the evacuation path with the lowest impedance. Using the features of the invention, this path includes the protection element 140 and the zone 150 that is electrically connected to the zero potential or ground. The electrical charge on the structure is therefore discharged via an electrical arc between the structure 130, by means of the protection element 140, and the zone 150, from which it is evacuated to ground. Such a discharge is therefore diverted from the circuit 120 without passing through the components 124 or the conductive tracks 122. The circuit 120 is therefore protected without adding additional electronic components to the circuit.

The invention applies in an analogous manner to more complex geometries, both at the level of the structure potentially carrying charges and at the level of the substrate supporting the electronic circuit to be protected. One example is illustrated by the FIG. 2 section, in which the circuit 220 including conductive tracks and an LED 224 is part of a substrate 210 of MID ("molded interconnect device") type or of molded or machined interconnection device type. The production of such devices is known in itself in the art and notably makes it possible to produce electronic circuits on substrates that have a complex geometry. The device 200 shown includes thermal dissipation means 250 such as a metal heatsink. The thermal dissipation means are connected to ground and are adapted to dissipate the heat produced by the components of the electronic circuit 220. In the example shown, the protection element 240 is fixed to the charge-carrying structure 230 and extends in the direction of a surface zone 250 of the metallic radiator 260 which is connected to ground. Alternatively, it is also possible to envisage a plastic element whose surface is at least partially metalized, the metallic coating being connected to ground, so as to implement the conductive element 250. Electrical charges accumulated on the structure 230 are therefore evacuated to ground by traveling through the protection element 240 and the conductive element 250.

The embodiment illustrated by the FIG. 3 diagram is similar to the arrangement shown in FIG. 1. Nonetheless, the protection element 340 is integral with the structure 330. The protection element has a spigot shape having a broad base and tapers with increasing distance from the structure 330, so as to form a tip directed towards the conducting zone 350 connected to ground. The zone 350 is in this embodiment formed by a conductive span on the substrate 310 which carries the electronic circuit to be protected. The distance D2 between the tip of the element 350, which has a concentration of static electrical charges, and the zone 350 is less than the distance D1 such as defined previously, in such a way that the charges accumulated in the tip flow by formation of an arc between the point and the zone 350, without passing through the components of the electronic circuit 320.

Although in the embodiments that have just been described by way of example a single protective element 130, 230, 330 is shown, a plurality of similar elements may be disposed in the manner that has just been described. It goes without saying that the protective element or elements is or are adapted to protect any electronic circuit disposed on one or more substrates provided that the distance D2 as defined is less than the shortest distance between the structure liable to be charged and each of the elements of each of the circuits to be protected.

Based on the description that has just been given and the accompanying figures, the application of the invention to more complex geometries will be obvious to the person skilled in the art having general background knowledge in the field.

The invention claimed is:

1. Lighting device for a motor vehicle, including a substrate on which is arranged at least one element of an electronic circuit including at least one electronic component sensitive to an electrostatic discharge, and
   a structure that is distinct from the substrate and liable to carry electrical charges, the shortest distance between the structure and each of the elements of the circuit being equal to D1, and
   an electrically conductive means connected electrically to ground, wherein the device comprises at least one protective element protecting against electrostatic discharges which is disposed on the structure and linked electrically to the latter, the smallest distance between the protective element and the electrically conductive means, D2, being less than D1.

2. Device according to claim 1, wherein the electrically conductive means comprises a zone of the substrate.

3. Device according to claim 1, wherein the device comprises a distinct metallic portion separate from the substrate, of which said electrically conductive means forms part.

4. Device according to claim 1, wherein the protective element comprises an electrically conductive metallic material.

5. Device according to claim 1, wherein the protective element is integral with said structure.

6. Device according to claim 1, wherein the protective element is a portion which is fastened to said structure.

7. Device according to claim 1, wherein the protective element extends from said structure to the electrically conductive means.

8. Device according to claim 1, wherein the substrate is the substrate of a printed circuit board (PCB).

9. Device according to claim 1, wherein the substrate is the substrate of an interconnection device (MID) having a complex geometry.

10. Device according to claim 1, wherein the electronic component is a light-emitting diode (LED), a laser diode or an organic light-emitting diode (OLED).

11. Device according to claim 1, wherein the structure is an element of the outer lens of the lighting device or a metalized plastic portion liable to carry electrical charges.

12. Device according to claim 1, wherein the device is a front light or a rear light of a motor vehicle.

13. Device according to claim 2, wherein the protective element comprises an electrically conductive metallic material.

14. Device according to claim 2, wherein the protective element is integral with said structure.

15. Device according to claim 2, wherein the protective element is a portion which is fastened to said structure.

16. Device according to claim 2, wherein the protective element extends from said structure to the electrically conductive means.

17. Device according to claim 2, wherein the substrate is the substrate of a printed circuit board (PCB).

18. Device according to claim 2, wherein the substrate is the substrate of an interconnection device (MID) having a complex geometry.

19. Device according to claim 2, wherein the electronic component is a light-emitting diode (LED), a laser diode or an organic light-emitting diode (OLED).

20. Device according to claim 2, wherein the structure is an element of the outer lens of the lighting device or a metalized plastic portion liable to carry electrical charges.

* * * * *